United States Patent
Lalonde et al.

(10) Patent No.: US 7,482,828 B2
(45) Date of Patent: Jan. 27, 2009

(54) METHODS AND APPARATUS FOR DEVICE TESTING AT THE WAFER LEVEL

(75) Inventors: Andre Richard Lalonde, Allen, TX (US); James Kenneth Guenter, Garland, TX (US); R. Stephen Speer, Sachse, TX (US)

(73) Assignee: Finisar Corporation, Sunnyvale, CA (US)

( * ) Notice: Subject to any disclaimer, the term of this patent is extended or adjusted under 35 U.S.C. 154(b) by 173 days.

(21) Appl. No.: 11/457,412

(22) Filed: Jul. 13, 2006

(65) Prior Publication Data

US 2007/0013400 A1 Jan. 18, 2007

Related U.S. Application Data

(60) Provisional application No. 60/698,890, filed on Jul. 13, 2005.

(51) Int. Cl.
*G01R 31/26* (2006.01)
(52) U.S. Cl. ...................................... 324/765
(58) Field of Classification Search ................ None
See application file for complete search history.

(56) References Cited

U.S. PATENT DOCUMENTS

| 4,464,759 | A | * | 8/1984 | Haus et al. | ................ 372/18 |
| 5,757,027 | A | * | 5/1998 | Kuchta | .................... 257/48 |
| 7,295,590 | B2 | * | 11/2007 | Crews | .............. 372/50.124 |

\* cited by examiner

*Primary Examiner*—Vinh P Nguyen
(74) *Attorney, Agent, or Firm*—Workman Nydegger

(57) ABSTRACT

AC and/or DC testing of an optoelectronic device at the wafer level. In one example embodiment, a method of testing one or more devices at a wafer level includes generating a test signal; supplying the test signal to a single device on a wafer; providing an output of the single device to each of a plurality of devices on the wafer by way of a common electrical connection between the single device and the plurality of devices; providing an output of each of the plurality of devices to a corresponding return connection by way of electrical connections between the plurality of devices and the plurality of return connections; and receiving return currents from each of the return connections.

22 Claims, 2 Drawing Sheets

METHODS AND APPARATUS FOR DEVICE TESTING AT THE WAFER LEVEL

RELATED APPLICATION

This application claims the benefit of U.S. Provisional Patent Application Ser. No. 60/698,890, entitled METHODS AND APPARATUS FOR AC PROBE TESTING, filed Jul. 13, 2005, and incorporated herein in its entirety by this reference.

BACKGROUND OF THE INVENTION

1. The Field of the Invention

This invention generally relates to the field of wafer level testing and more specifically, to AC and/or DC testing of optoelectronic devices at the wafer level.

2. Related Technology

Optoelectronic devices such as lasers are commonly used in many modern components. One use that has recently become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a relatively high optical output to a relatively lower optical output.

One type of optoelectronic device that is used in optical data transmission is a Vertical Cavity Surface Emitting Laser (VCSEL). A VCSEL is typically constructed on a semiconductor wafer such as Gallium Arsenide (GaAs). VCSELs are generally formed as semiconductor diodes. Manufacturers of optoelectronic devices such as VCSELs typically perform various performance tests on the devices before they are delivered to distributors and end customers. This performance testing can be used to detect defects in optoelectronic devices. This performance testing can also be used to sort optoelectronic devices into groups of devices that are suitable for some applications but are not suitable for other applications.

One type of testing that is performed on optoelectronic devices is DC testing. DC testing is used to quantify operational characteristics of the optoelectronic devices when DC currents and voltages, such as bias currents and voltages, are applied to the devices. DC testing can be used to quantify light intensity-current-voltage (LIV) characteristics. DC testing can be performed at the wafer level on devices that have individual top side contacts and a common bottom contact. Nonetheless, even at the wafer level, DC testing for a 3 inch wafer of laser diodes may take a relatively long time, as long as 12 to 14 hours for example.

Another type of testing performed on optoelectronic devices is AC testing. AC testing quantifies the operation characteristics of the optoelectronic devices when AC currents and voltages, such as modulation currents and voltages, are applied to the devices. Commonly, data derived from AC testing is used to generate an eye diagram.

An eye diagram is a graph illustrating, in one example, power output as a result of AC modulation. For example, a constant AC signal, such as a digital square wave at a given frequency, is used to modulate a laser diode. In one example, high values of the digital square wave correspond to logical 1s, while low values of the digital square wave correspond to digital 0s. The power output of the laser diode is then graphed for a half cycle as a function of time. Successive half cycles of the power output are graphed and overlaid on one another. This process provides a visual depiction of the area in which one could expect to find a high (logical 1) or low (logical 0) power output. The eye diagram can be used to quantify characteristics such as rise time, fall time, jitter, and overshoot.

Some optoelectronic devices formed on a wafer share a common bottom contact. In present systems, AC testing for these optoelectronic devices is performed at the device level after the optoelectronic devices have been separated from the wafer. This AC testing is performed at the device level because the capacitance between the individual top contact and the common bottom contact is too large to effectively test high frequency response when each optoelectronic device is tested at the wafer level. In particular, testing at above, for example, 1.5 GHz is difficult, if not impossible, on optoelectronic devices in a wafer where the optoelectronic devices have a common bottom contact and individual top contacts.

Testing at the wafer level can be performed at a much faster rate than testing at the device level. Preparing to test at the wafer level requires a single act of mounting an entire wafer in a test apparatus. Preparing to test at the device level requires that each device to be tested be cut from the wafer, packaged, and mounted in a test apparatus. Because of the amount of time that would be required to individually test every device from a wafer, current methods of device testing have relied on statistical sampling to reduce the amount of AC testing that is done for a wafer batch of devices. This statistical sampling involves testing only a statistically significant percentage of the devices from a wafer, such as 20 out of about 65,000. If a certain percentage, for example 20%, of the sampled devices fail testing, the entire wafer batch of devices is discarded.

Current methods of AC testing can result in wasted resources. If DC testing is performed on the entire wafer prior to a failing AC testing, 12-14 hours of DC testing are wasted in performing the DC testing. Further, while a wafer may include a significant number of working devices, or may contain devices that will meet some customers' specifications while not meeting others, if a certain percentage of the sampled devices fail testing, even the working devices from the wafer are completely discarded.

BRIEF SUMMARY OF SOME EXAMPLE EMBODIMENTS

In general, example embodiments of the invention are concerned with AC and/or DC testing of components at the wafer level.

In one example embodiment, a method of testing one or more devices at a wafer level includes generating a test signal; supplying the test signal to a single device on a wafer; providing an output of the single device to each of a plurality of devices on the wafer by way of a common electrical connection between the single device and the plurality of devices; providing an output of each of the plurality of devices to a corresponding return connection by way of electrical connections between the plurality of devices and the plurality of return connections; and receiving return currents from each of the return connections.

In another example embodiment, a test apparatus for performing testing of a device at the wafer level includes a test probe configured to be electrically connected to a device under test, where the device under test is on a wafer. The test probe is also configured to be electrically connected to a current source in order for current to pass from the current source to the device under test through the test probe. The test apparatus also includes a plurality of return probes, each of which is configured to be electrically connected to one of a plurality of other devices on the wafer where the plurality of other devices are electrically connected to the device under test. In addition, the plurality of return probes are also configured to be electrically connected to the return of the current source in order for current to return from the device under test to the return of the current source through the plurality of other devices and the plurality of return probes.

These and other aspects of example embodiments of the present invention will become more fully apparent from the following description and appended claims.

BRIEF DESCRIPTION OF THE DRAWINGS

To further clarify the above and other aspects of the present invention, a more particular description of these examples will be rendered by reference to specific embodiments thereof which are disclosed in the appended drawings. It is appreciated that these drawings depict only example embodiments of the invention and are therefore not to be considered limiting of its scope. It is also appreciated that the drawings are diagrammatic and schematic representations of exemplary embodiments of the invention, and are not limiting of the present invention nor are they necessarily drawn to scale. The invention will be disclosed and explained with additional specificity and detail through the use of the accompanying drawings in which.

DETAILED DESCRIPTION OF SOME EXAMPLE EMBODIMENTS

As noted above, example embodiments of the invention are concerned with AC and/or DC testing of components at the wafer level. Example embodiments allow for AC and/or DC testing to be performed at the wafer level on various optoelectronic devices using common test components. Among other things, using common test components facilitates quicker and more efficient overall testing at the wafer level of various optoelectronic devices. Furthermore, AC testing of components at the wafer level results in time and cost savings over testing of AC testing of components at the device level.

One example embodiment disclosed herein includes a test apparatus that allows for AC testing of optoelectronic devices at the wafer level. By AC coupling the return path of an AC test circuit used to test a device through other devices on the wafer, capacitance in the test circuit can be reduced sufficiently such that AC testing can be accomplished effectively at the wafer level. The device under test may, or may not, be located adjacent to the other devices on the wafer.

Figure 1:
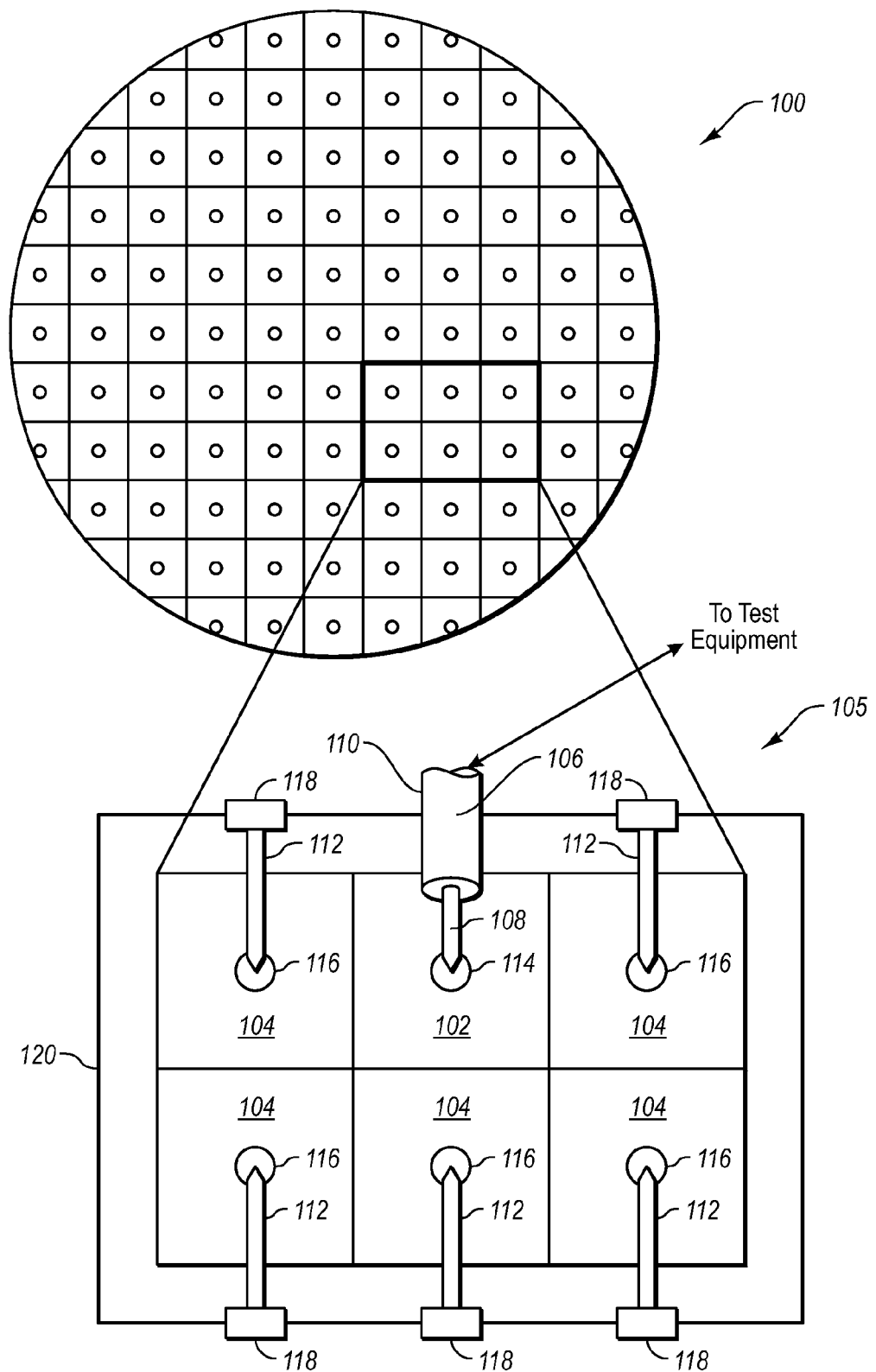
FIG. 1 discloses a wafer and an embodiment of a test apparatus.

Referring now to FIG. 1, one example embodiment of a test apparatus 105 is disclosed as being useful for testing devices on a wafer 100. The wafer 100 has a number of devices formed through various lithographic processes. The number of devices depicted does not necessarily reflect the number of devices typically included on a wafer. A wafer may contain, in one example, as many as 65,000 devices. FIG. 1 discloses a device under test 102. The term "device under test" as used herein refers to an optoelectronic device on a wafer in connection with which AC and/or DC testing is to be performed. Examples of optoelectronic devices include, but are not limited to, optical emitters such as VCSELs and optical detectors such as photodiodes. The device under test 102 is surrounded by devices 104. Although device 104 are disclosed as being adjacent on the wafer 100 to the device under test 102, it is contemplated that some or all of the devices 104 could be non-adjacent on the wafer 100 to the device under test 102.

The test apparatus 105 of FIG. 1 includes several components including a test probe 106. The test probe 106 includes a test needle 108 and a shield 110. The test needle 108 and shield 110 are electrical connections used to send and receive electrical signals, such as bias and modulation signals, to the device under test 102. The test needle 108 is electrically connected to the device under test 102 at a top contact 114 of the device under test 102. In one example embodiment, the electrical connection can be achieved by pressing the point of the test needle 108 against the surface of the top contact 114. It is contemplated, however, that any other type of suitable of electrical connection or coupling can be used to achieve the electrical connection between the test apparatus 105 and the top contact 114. The top contact 114 in this example can be an anode contact of an optoelectronic device.

The term "top contact" as used herein does not require any specific orientation of the wafer or device. Rather, the term "top contact" as used herein refers to a contact formed on one or more epitaxial layers of a device. For example, a top contact may be a contact formed lithographically on a device after various epitaxial layers of an epitaxial structure have been removed to expose a particular layer or material of the device. In at least some embodiments, top contacts are separate and non-contiguous as between different devices on the same wafer structure. A top contact, in one example, is used to provide a connection point to the anode of an optoelectronic device.

In contrast, the term "bottom contact" as used herein refers to what is usually one large common contact on the underside of a wafer that is the side opposite that on which the devices are situated. The bottom contact that provides a common electrical connection to multiple devices on a wafer. For example, the bottom contact may electrically connect all of the cathodes of optoelectronic devices together at the wafer level.

A top contact 116 of each of the devices 104 is electrically connected to a return probe 112. The return probes 112 are AC coupled to the top contacts 116 by capacitors 118. The term "AC coupled" as used herein refers to an electrical connection that allows substantially all AC signals to pass through and blocks substantially all DC signals. The return probes 112 share a common connection through the devices 104, as disclosed in greater detail in FIG. 2. The capacitors 118 also share a common connection disclosed schematically at 120. In the example disclosed in FIG. 1, five devices 104 are each connected to a corresponding return probe 112.

In one example embodiment of the test apparatus 105, the function of the capacitors 118 can be accomplished using the natural pn-junction capacitance of the diodes 104. In this example embodiment, it may be necessary to slightly reverse-bias these pn junctions in order to prevent the capacitance from changing rapidly as the AC current from diode 102 passes through the diodes 104. Therefore, the capacitors 118 need not be included in the test apparatus 105 when the natural pn-junction capacitance of the diodes 104 enables the diodes 104 to function as a capacitive element.

Figure 2:
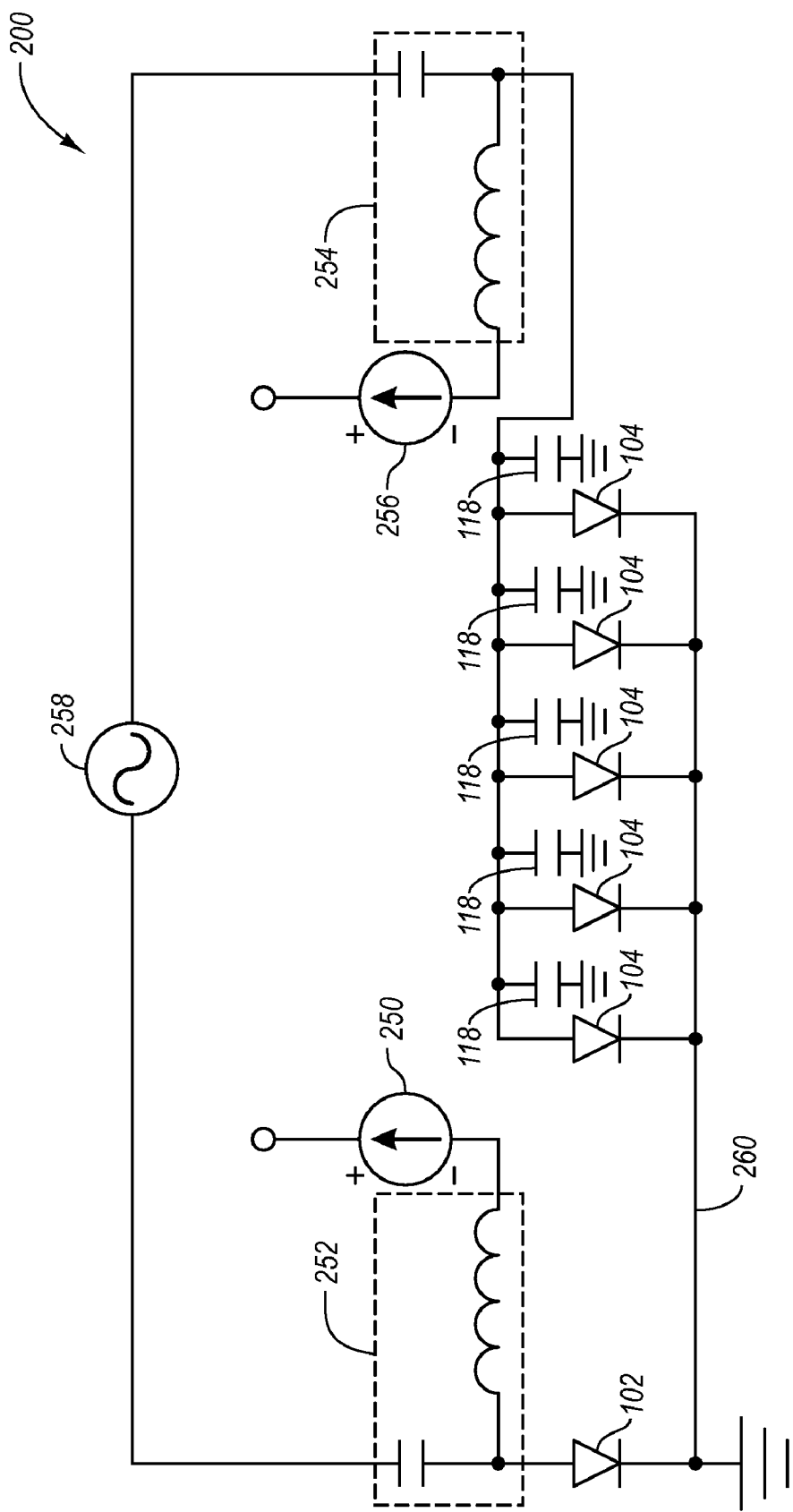
FIG. 2 discloses a schematic of an embodiment of a circuit of the test apparatus of FIG. 1.

A schematic of an example circuit 200 associated with the test apparatus 105 of FIG. 1 is disclosed in FIG. 2. As disclosed in FIG. 2, the device under test 102 is DC biased with a first DC current source 250. The first DC current source 250 provides the DC bias current through a first bias tee 252 to the device under test 102. The devices 104 are biased through a second bias tee 254 by a second DC current source 256.

An AC test source 258 is also connected to the device under test 102. The return path for the current provided by the AC test source 258 is through the devices 104 and the capacitors 118. In one example embodiment, the AC test source 258 may be a square wave generator, but other AC test sources may be employed.

The capacitors 118 are configured so as to AC couple the return path for the current from the AC test source 258 to the device under test 102. The capacitors may be selected to be of an appropriate capacitance for testing at a desired frequency, such as at a frequency of 1.5 Gigahertz for example. Other frequencies above or below 1.5 Gigahertz are also possible. As disclosed in FIG. 2, the path of AC current used in testing the device under test 102 is through the devices 104 and the capacitors 118.

In one example embodiment of the circuit 200, the function of the capacitors 118 can be accomplished using the natural pn-junction capacitance of the diodes 104, as disclosed above in connection with the test apparatus 105 of FIG. 1. In this example embodiment of the circuit 200, it may be necessary to slightly reverse-bias these pn junctions in order to prevent the capacitance from changing rapidly as the AC current from diode 102 passes through the diodes 104. Therefore, capacitors 118 need not be included in the test apparatus 105 when the natural pn-junction capacitance of the diodes 104 enables the diodes 104 to function as a capacitive element.

In another example embodiment of the circuit 200, the diodes 104 are forward biased into the linear portion of their current-voltage curve, and the AC return current flows through what is effectively a small resistance rather than through any capacitance.

In operation, the device under test 102 is biased to a lasing state using the first DC current source 250. The device under test is then modulated using the AC test source 258 to simulate AC operating conditions. Because the return path for the AC current from the AC test source 258 includes the devices 104 and the capacitors 118, the relatively large capacitance that would otherwise be caused by the common bottom contact is reduced or eliminated, thus allowing for testing at relatively higher frequencies.

The example embodiments disclosed herein may be useful for performing certain types of AC tests. In particular, the example embodiments may be used to quantify characteristics to generate an eye diagram. The eye diagram and testing can be used to quantify characteristics such as, for example, rise time, fall time, jitter, and overshoot.

The embodiment disclosed in FIGS. 1 and 2 may also be used to perform various DC tests in conjunction with the AC testing. In particular, the test probe 106 may be used to supply DC currents to the device under test 102. The return path for the DC currents is through the common bottom contact. The common bottom contact is not visible in FIG. 1, but is represented by the common connection 260 disclosed in FIG. 2.

The example embodiment disclosed in FIGS. 1 and 2 also allows for AC and DC testing to be performed at the wafer level with the same test apparatus 105. For example, a DC current source, such as DC current sources 250 and 256, can be used to generate DC test currents. This arrangement helps to eliminate the need for mounting the wafer in different test apparatuses, and the need to separate each of the individual devices in the wafer for DC testing. DC testing that may be performed includes, for example, tests to quantify LIV characteristics.

Additionally, the simultaneous AC and DC testing enabled by the example embodiments disclosed in FIGS. 1 and 2 allows a wafer with an unacceptable number of failed devices to be identified before all wafer devices have been tested. This identification allows a wafer having an unacceptable number of failed devices to be discarded. For example, given a wafer with an unacceptable number of devices that would fail AC testing but pass DC testing, the AC failures can be identified more quickly when AC tests are performed simultaneously with the DC tests than where all wafer devices are DC tested before being AC tested. When a sufficient number of devices on a wafer have failed either AC or DC testing using the example embodiment disclosed herein, all testing of the wafer can be ended in order to save testing resources for other wafers.

Further, whereas previous types of testing necessitated passing or failing of an entire wafer, the apparatus and methods disclosed herein can be used to qualify or disqualify portions comprising less than an entire wafer. For example, a portion of a wafer can be certified for a particular customer based on the performance of the devices in that portion of the wafer. Thus, if devices on one portion of a wafer have performance characteristics that will meet some customers' requirements but not other customers' requirements, those devices can be utilized for only those customers whose requirements are met. Thus, where entire wafers may have been discarded before, now portions of wafers can be spared and selectively utilized. The ability to spare portions of wafers having failed devices allows the manufacturer to salvage at least some value from the wafers instead of losing all value by discarding the entire wafer. This can help to reduce the overall per/unit cost of producing optoelectronic devices.

The testing disclosed herein can also be performed at various temperatures. For example, testing may be performed in temperature control ovens at temperatures of 0° C., 25° C. and 85° C. to verify component reliability at various temperatures. Other temperatures and environmental conditions may also be used in connection with the disclosed testing systems and processes.

The present invention may be embodied in other specific forms without departing from its spirit. The disclosed embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of testing one or more devices at a wafer level, the method comprising:
    generating a test signal;
    supplying the test signal to a single device on a wafer;
    providing an output of the single device to each of a plurality of devices on the wafer by way of a common electrical connection between the single device and the plurality of devices;
    providing an output of each of the plurality of devices to a corresponding return connection by way of electrical connections between the plurality of devices and the plurality of return connections; and
    receiving return currents from each of the return connections.

2. The method as recited in claim 1, wherein supplying the test signal to the single device on the wafer comprises one of:
    supplying an AC test signal to the single device on the wafer;
    or supplying a DC signal to the single device on the wafer.

3. The method as recited in claim 1, wherein generating the test signal comprises generating a digital square wave.

4. The method as recited in claim 1, wherein generating the test signal comprises generating a test signal having a frequency of at least 1.5 Gigahertz 5. The method as recited in claim 1, further comprising using the return currents to quantify eye characteristics of the single device including at least one of rise time, fall time, jitter or overshoot.

6. The method as recited in claim 1, wherein the test signal is an AC test signal and further comprising performing DC testing on the single device by repeating the method as recited in claim 1 using a DC test signal.

7. The method as recited in claim 6, wherein performing DC testing further comprises taking LIV measurements.

8. The method as recited in claim 1, further comprising reverse biasing a pn junction of the plurality of devices.

9. The method as recited in claim 1, further comprising capacitively coupling each of the return connections to each other.

10. The method as recited in claim 1, further comprising forward biasing the plurality of devices into the linear portion of their respective current-voltage curves.

11. A test apparatus for performing testing of a device at the wafer level, the test apparatus comprising:
a test probe configured to be electrically connected to a device under test, where the device under test is on a wafer, the test probe also configured to be electrically connected to a current source in order for current to pass from the current source to the device under test through the test probe; and
a plurality of return probes, each of which is configured to be electrically connected to one of a plurality of other devices on the wafer where the plurality of other devices are electrically connected to the device under test; the plurality of return probes also being configured to be electrically connected to the return of the current source in order for current to return from the device under test to the return of the current source through the plurality of other devices and the plurality of return probes.

12. The test apparatus as recited in claim 11, wherein the current source is an AC current source and the test probe is further configured to be electrically connected to a first DC bias current source for providing a DC bias current to the device under test.

13. The test apparatus as recited in claim 12, further comprising a first bias tee electrically connected to the test probe, the first bias tee providing an electrical connection by way of which the test probe is configured to be electrically connected to the first DC bias current source.

14. The test apparatus as recited in claim 11, wherein the test probe is configured to be electrically connected to a current source comprising a square wave generator.

15. The test apparatus as recited in claim 11, further comprising a second bias tee, the plurality of return probes being configured to be electrically connected to a second DC bias current source by way of the second bias tee.

16. The test apparatus as recited in claim 11, wherein:
the test probe is configured to be electrically connected to a device under test comprising one of an optical emitter or an optical detector.

17. The test apparatus as recited in claim 11, wherein:
the test probe is configured to be electrically connected to an anode of the device under test; and
each of the plurality of return probes is configured to be electrically connected to an anode of one of the plurality of other devices.

18. The test apparatus as recited in claim 11, wherein each of the plurality of return probes is configured to be electrically connected to one of a plurality of other devices on the wafer, where the plurality of other devices are electrically connected by way of a common cathode to the device under test.

19. The test apparatus as recited in claim 11, wherein the test probe comprises a test needle electrically connected to a shield.

20. The test apparatus as recited in claim 11, wherein the test apparatus is configured to perform AC testing comprising quantifying eye characteristics including at least one of rise time, fall time, jitter and overshoot.

21. The test apparatus as recited in claim 11, wherein the test apparatus is configured to perform DC testing comprising taking LIV measurements.

22. The test apparatus as recited in claim 11, further comprising: a plurality of capacitors, each of which is electrically connected to one of the plurality of return probes.

* * * * *

UNITED STATES PATENT AND TRADEMARK OFFICE
CERTIFICATE OF CORRECTION

| | | |
|---|---|---|
| PATENT NO. | : 7,482,828 B2 | |
| APPLICATION NO. | : 11/457412 | |
| DATED | : January 27, 2009 | |
| INVENTOR(S) | : Lalonde et al. | |

It is certified that error appears in the above-identified patent and that said Letters Patent is hereby corrected as shown below:

<u>Column 4</u>
Line 2, change "device 104 are" to --the devices 104 are--

<u>Column 7</u>
Line 3, insert --.-- after "Gigahertz"

Signed and Sealed this
Twenty-second Day of February, 2011

David J. Kappos
*Director of the United States Patent and Trademark Office*